United States Patent
Sutardja et al.

(10) Patent No.: US 8,987,893 B1
(45) Date of Patent: Mar. 24, 2015

(54) HEAT DISSIPATING INTERPOSERS

(71) Applicant: Marvell International Ltd., Hamilton (BM)

(72) Inventors: Sehat Sutardja, Los Altos Hills, CA (US); Albert Wu, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 76 days.

(21) Appl. No.: 13/655,311

(22) Filed: Oct. 18, 2012

Related U.S. Application Data

(60) Provisional application No. 61/548,483, filed on Oct. 18, 2011.

(51) Int. Cl.
*H01L 23/34* (2006.01)

(52) U.S. Cl.
CPC ................... *H01L 23/34* (2013.01)
USPC .......... 257/713; 257/714; 257/715; 257/716; 257/721; 257/722

(58) Field of Classification Search
None
See application file for complete search history.

(56) References Cited

U.S. PATENT DOCUMENTS

| | | | | |
|---|---|---|---|---|
| 6,219,237 | B1* | 4/2001 | Geusic et al. | 361/699 |
| 6,496,370 | B2* | 12/2002 | Geusic et al. | 361/699 |
| 6,621,071 | B2* | 9/2003 | Sobel et al. | 250/238 |
| 7,112,883 | B2* | 9/2006 | Hasunuma | 257/714 |
| 2001/0026439 | A1* | 10/2001 | Geusic et al. | 361/699 |

OTHER PUBLICATIONS

V. Lehman, "The Physics of Macropote [sic] Formation in Low Doped N-type Silicon", J. Electrochem. Soc., vol. 140, No. 10, Oct. 1993, pp. 2836-2843.*

* cited by examiner

*Primary Examiner* — David E Graybill

(57) ABSTRACT

Embodiments of the present disclosure provide an apparatus that comprises a connection circuit situated within a substrate and configured to communicatively couple a first integrated circuit disposed adjacent to a top surface of the apparatus to a second integrated circuit disposed adjacent to a bottom surface of the apparatus. The apparatus further comprises one or more enclosed heat dissipation structures situated within the substrate and configured to convey heat away from the first and second integrated circuits.

14 Claims, 4 Drawing Sheets

HEAT DISSIPATING INTERPOSERS

CROSS REFERENCE TO RELATED APPLICATIONS

This present disclosure claims priority to U.S. Provisional Patent Application No. 61/548,483, filed on Oct. 18, 2011, incorporated herein by reference.

TECHNICAL FIELD

Embodiments of the present disclosure relate to the field of stacked integrated circuits, and more particularly to devices and systems for dissipating heat in stacked integrated circuits.

BACKGROUND

Stacked semiconductor chips have greater power consumption and higher operating temperatures in comparison with conventional non-stacked integrated circuits. This higher temperature and power consumption can be problematic. For example, the relatively high operating temperatures associated with stacking a dynamic random access memory (DRAM) die on a high-power System-on-Chip (SoC) may result in erasing the data stored in the DRAM. Conventional systems use bulky and expensive heat-sink structures to handle the high temperatures caused by stacked chips. These bulky structures have relatively larger form factors that mitigate to some extent the size advantages that result from stacking integrated circuits.

The background description provided herein is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure.

SUMMARY

In an embodiment, the present disclosure provides an apparatus that comprises a connection circuit situated within a substrate and configured to communicatively couple a first integrated circuit disposed adjacent to a top surface of the apparatus to a second integrated circuit disposed adjacent to a bottom surface of the apparatus. The apparatus further comprises one or more enclosed heat dissipation structures situated within the substrate and configured to convey heat away from the first and second integrated circuits.

In a further embodiment, the present disclosure provides a system that comprises a first integrated circuit, a second integrated circuit, and an interposer disposed between a bottom surface of the first integrated circuit and a top surface of the second integrated circuit. The interposer includes a connection circuit configured to communicatively couple the first integrated circuit to the second integrated circuit. At least one of (i) a surface area of a top surface of the interposer is greater than a bottom surface area of the first integrated circuit, and (ii) a surface area of the bottom surface of the interposer is greater than a top surface area of the second integrated circuit.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

As noted above, stacked integrated circuits (ICs) produce more heat than conventional ICs. Embodiments of the present disclosure utilize interposers to dissipate heat from stacked ICs. The interposers include an enclosed heat dissipation structure, such as a coolant-filled microchannel, that acts via convection, coolant phase changes, or some other action to circulate the coolant throughout the enclosed heat dissipation structure and to dissipate heat away from the ICs into the surrounding environment. The interposers also include connection circuitry—including, for example, electrically conductive features such as through-silicon vias (TSVs) or similar structures—to communicatively couple the stacked ICs to one another. The interposers have larger horizontal surface areas than do the integrated circuits, which results in a portion of the interposers' top and bottom surfaces being non-adjacent to the ICs. These non-adjacent top and bottom surfaces of the interposers provide surface area for heat dissipation into the surrounding environment. By utilizing an enclosed heat dissipation structure, embodiments enable three-dimensional stacking of integrated circuits without bulky or expensive heat sink structures.

Figure 1:
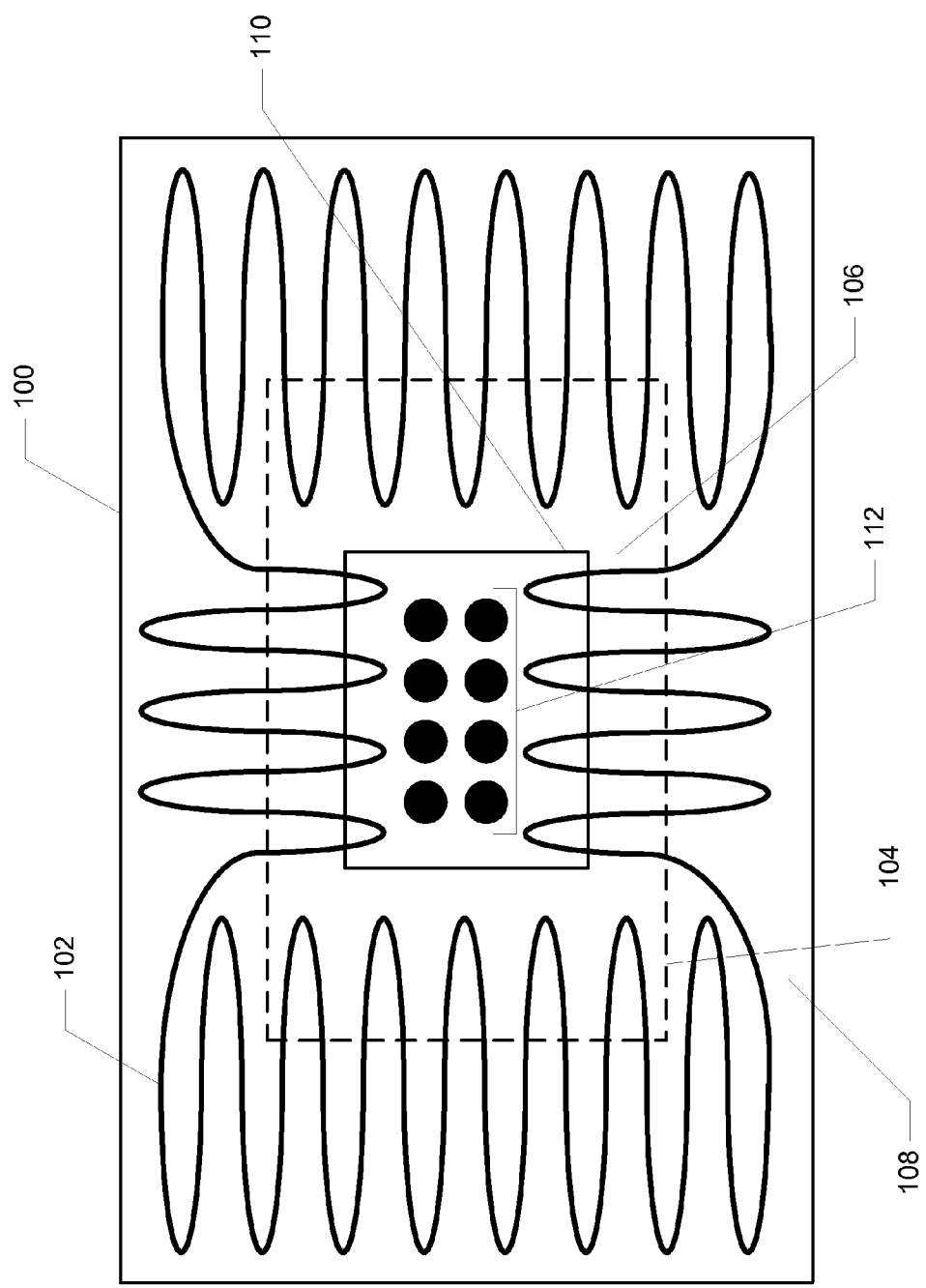
FIG. 1 illustrates a cross-sectional top view of an example interposer having an enclosed heat dissipation structure.

FIG. 1 illustrates a cross-sectional top view of an example interposer 100 having an enclosed heat dissipation structure 102. The interposer is manufactured from a substrate, such as silicon, germanium, gallium arsenide, silicon carbide, and so forth. The dashed line box 104 illustrates the portion of the top surface of the interposer 100 that will be in contact with, or adjacent to, an integrated circuit. Thus, adjacent surface 106 of the interposer 100 is configured to be directly adjacent to an integrated circuit, and a similar surface on the bottom of the interposer 100 is configured to be directly adjacent to another integrated circuit. These adjacent surfaces therefore act as heat sinks for the adjacent integrated circuits. A non-adjacent surface 108 is not in close proximity with an integrated circuit, and is thus able to dissipate heat into the surrounding environment.

In the example shown in FIG. 1, the enclosed heat dissipation structure 102 may include a channel, which may be filled with a liquid or gas coolant. Example coolants include alcohols, various inert gasses (such as helium gas), carbon dioxide, water, air, hydrogen gas, and so forth. Embodiments are not limited to any particular coolant or coolants. The channel may be fabricated into the substrate of the interposer 100 using, for example, microelectromechanical systems (MEMS) technology. The channel of the enclosed heat dissipation structure 102 may have various cross-sectional geometries (such as rounded, elliptical, square, rectangular, triangular, and so forth), and may have a micro-scale dimensions, such as a radii in the range of 1 to 100 micrometers.

Although the enclosed heat dissipation structure 102 is illustrated in FIG. 1 as including a serpentine-shaped channel, the enclosed heat dissipation structure 102 may also include different or additional structures, such as one or more non-serpentine shaped channels, chambers, fins, channels with fins, spokes elements, asymmetrical elements and so on. Furthermore, the enclosed heat dissipation structure 102 may include configurations and/or other structures that are designed to facilitate or improve fluid dynamics or movement of the coolant along the channel thereby aiding heat dissipation. For example, along selected sections of the channel, fins may be added to cause the coolant to flow predominantly in one direction (conversely, the fins discourage the flow of the coolant in the other direction). Based on the disclosure provided herein, other types of structures that facilitate and/or improve fluid dynamics or movement may be used to implement the enclosed heat dissipation structure 102. Interposers according to embodiments are not limited to any particular enclosed heat dissipation structure or structures.

The interposer 100 includes a connection circuit 110 configured to communicatively couple an IC adjacent to the top surface of the interposer 100 to another IC adjacent to the bottom surface of the interposer 100. In the example shown in FIG. 1, the connection circuit 110 includes a plurality of conductive features 112. The conductive features 112 may include through-silicon vias (TSVs), through-package vias (TPVs), or other types of conductive features. The conductive features 112 may include an electrically conductive material such as aluminum (Al), copper (Cu), aluminum-copper alloy, nickel (Ni), or other conductive material. The electrically conductive material may be deposited by electrodeposition, evaporation, a sputtering process, or other suitable process. Although not shown in FIG. 1, the enclosed heat dissipation structure 102 may include a portion that winds between the conductive features 112.

As noted above, the adjacent surface 106 of the interposer 100 is configured to be directly adjacent to an integrated circuit, and non-adjacent surface 108 is exposed to the outside environment (which may include, for example, air). And the enclosed heat dissipation structure 102 is situated within a substrate of the interposer 100, with a part of it underneath both the adjacent surface 106 and a part of it underneath the non-adjacent surface 108. Thus, the coolant within the enclosed heat dissipation structure 102 absorbs heat from the integrated circuit(s) while the coolant is in a portion of the heat dissipation structure 102 that is underneath or near the surface 106. By one or more of phase change action, fluid convection, or other, the coolant is conveyed to a portion of the enclosed heat dissipation structure 102 that is underneath or near the non-adjacent surface 108. The heated coolant then radiates the heat into the relatively cooler surrounding substrate of this portion of the interposer 100. The heat is ultimately radiated from a surface of the interposer 100, such as the non-adjacent surface 108, to the outside environment. The coolant returns to the portion of the enclosed heat dissipation structure 102 that is underneath or near the adjacent surface 106, and the process repeats itself.

Figure 2:
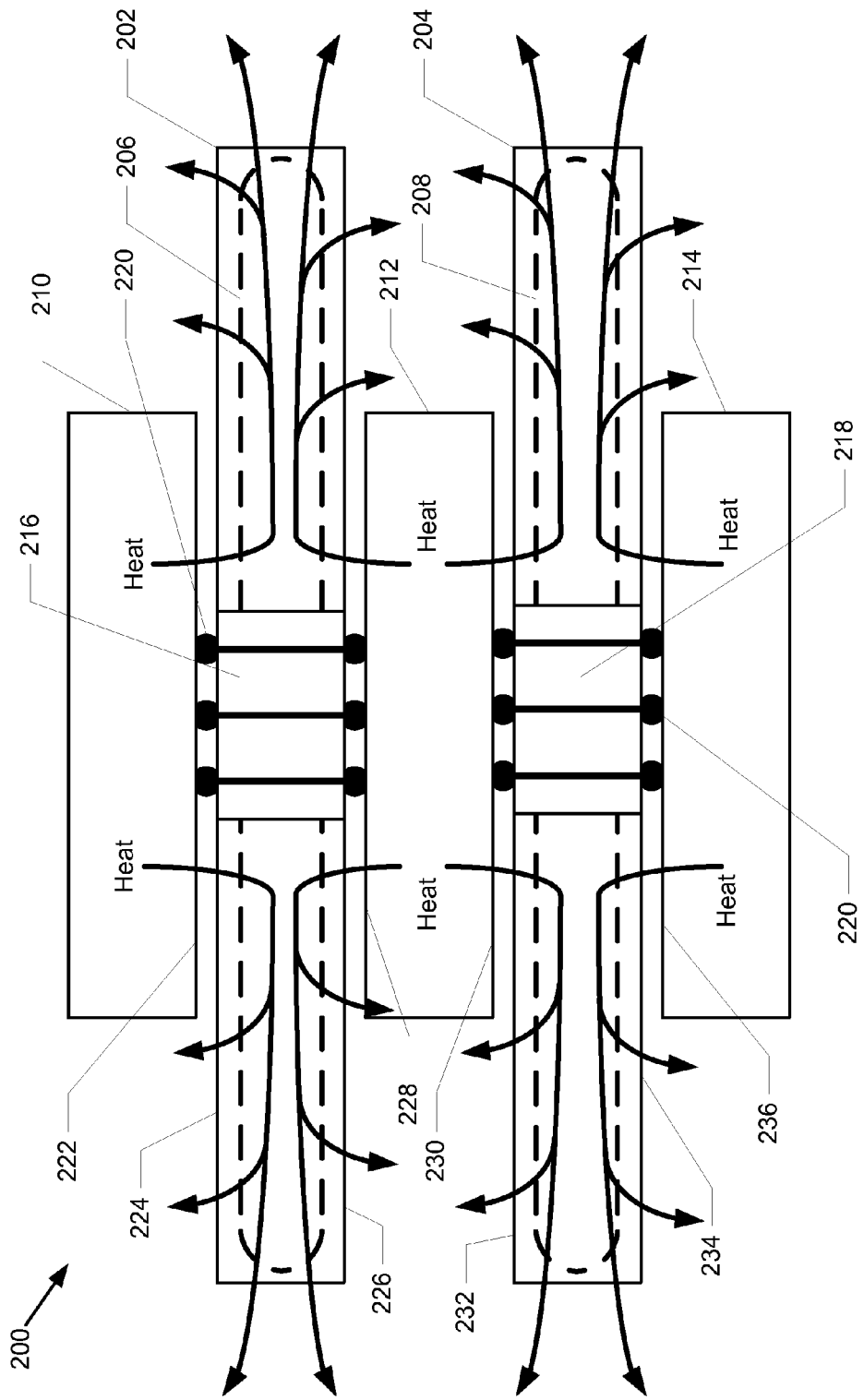
FIG. 2 illustrates a cross-sectional side view of a stacked system having interposers with enclosed heat dissipation structures.

FIG. 2 illustrates a cross-sectional side view of a stacked system 200 having interposers 202 and 204 with enclosed heat dissipation structures 206 and 208 according to various embodiments. The interposer 202 is situated between the ICs 210 and 212; and the interposer 204 is situated between the ICs 212 and 214. Although the example stacked system 200 shown in FIG. 2 includes two interposers and three ICs, more or fewer interposers and ICs may be utilized without departing from the scope of embodiments. In various embodiments, one or more of the ICs 210, 212, and 214 may include one or more of a microcontroller, a controller, a microprocessor, a System on a Chip (SoC), a memory device (such as a random access memory (RAM), a read-only memory (ROM), a solid state memory such as Flash memory, an Electrically Erasable Programmable Read-Only memory (EEPROM), or other memory), an application-specific integrated circuit (ASIC), a programmable logic chip (such as a field programmable gate array (FPGA), and so on. Embodiments are not limited to any one type or types of integrated circuits.

Interposer 202 includes connection circuitry 216 and the interposer 204 includes connection circuitry 218. The connection circuitry 216 and/or 218 may include various conductive features, such as TSVs, TSPs, and so forth. The connection circuitry 216 and the connection circuitry 218 communicatively couple the ICs to one another, such as through electrical contacts 220. The electrical contacts 220 may be solder balls or other contacts.

As illustrated in FIG. 2, a bottom surface 222 of the IC 210 is adjacent to a top surface 224 of the interposer 202. There may be a small gap between the top surface 224 and the bottom surface 222, or the top surface 224 and the bottom surface 222 may be flush with one another or otherwise in direct contact. In any event, the top surface 224 and the bottom surface 222 are in close proximity, and heat produced by the operation of the IC 210 is sunk into the interposer 204 via that portion of the top surface 224 adjacent to or in close proximity to the bottom surface 222 of the IC 210. Similarly, heat radiates into the bottom surface 226 of the interposer 202 from the top surface 228 of the IC 212, from a bottom surface 230 of the IC 212 into the top surface 232 of the interposer 204, and into a bottom surface 234 of the interposer 204 from the top surface 236 of the IC 214.

The enclosed heat dissipation structures 206 and 208 (shown as dashed lines) act, such as via one or more of phase change action, convection, or other action, to convey coolant from portions of the substrates of the interposers 202 and 204 that are adjacent to the ICs 210, 212, and 214, to portions of the substrates of the interposers 202 and 204 near non-adjacent surfaces of the interposers. As depicted by the arrows in FIG. 2, the heat sunk into the interposers 202 and 204 from the ICs 210, 212, and 214 is conveyed via coolant away from portions of the interposers 202 and 204 that are adjacent to the ICS, and the heat is ultimately radiated from the surfaces of the interposers 202 and 204 into the outside environment, thereby cooling the ICs 210, 212, and 214.

Figure 3:
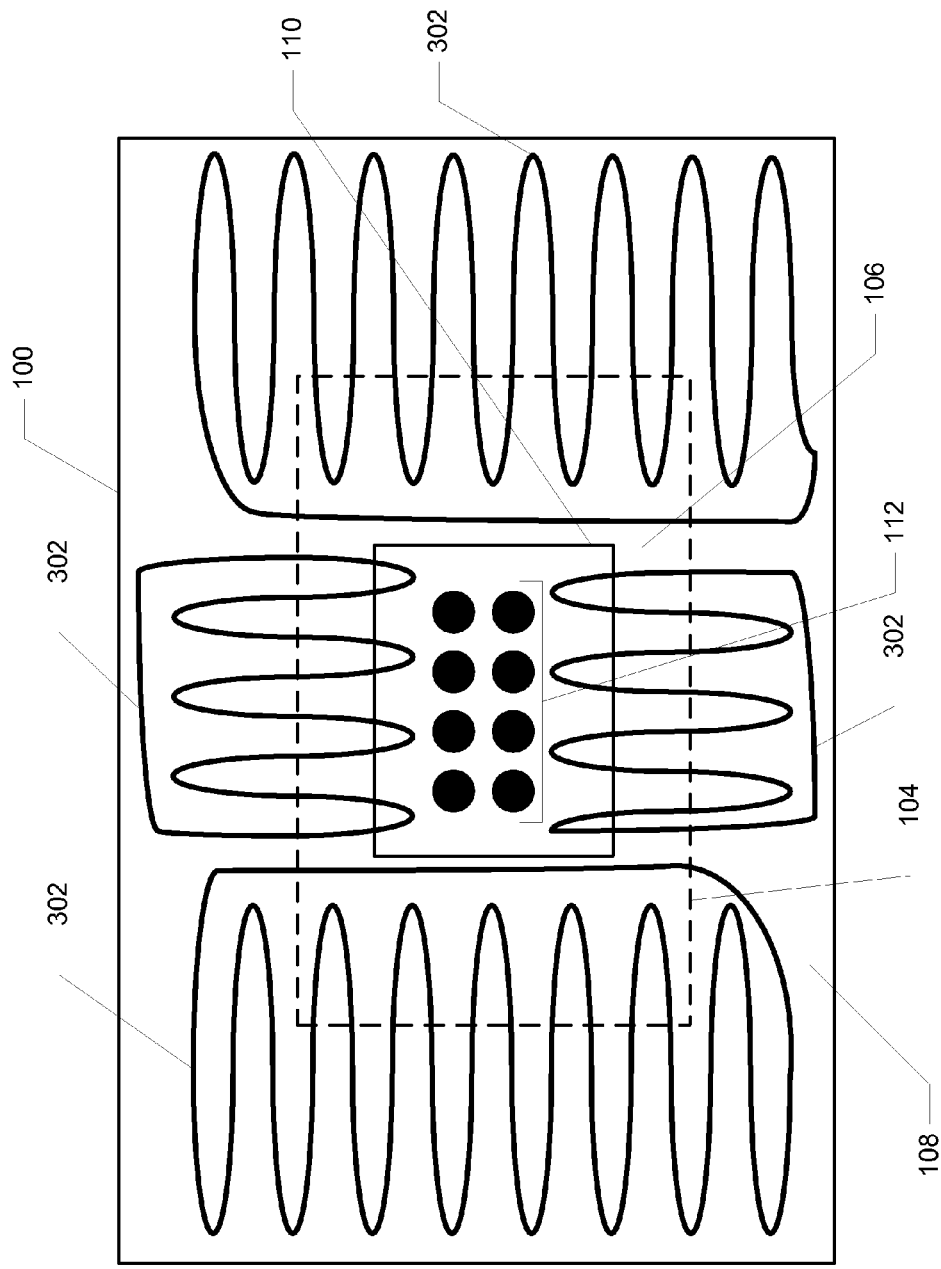
FIG. 3 illustrates a cross-sectional top view of the interposer having a plurality of enclosed heat dissipation structures.

FIG. 3 illustrates a cross-sectional top view of the interposer 100 having a plurality of enclosed heat dissipation structures 302. The enclosed heat dissipation structures 302 are spaced apart within the horizontal plane of the interposer 100, providing heat dissipation to different portions of the interposer 100 (such as by conveyance of a coolant as described elsewhere within this detailed description). In the same or different embodiments, the interposer 100 may include multiple layers of enclosed heat dissipation structures (i.e. enclosed heat dissipation structures spaced apart in a vertical plane).

Figure 4:
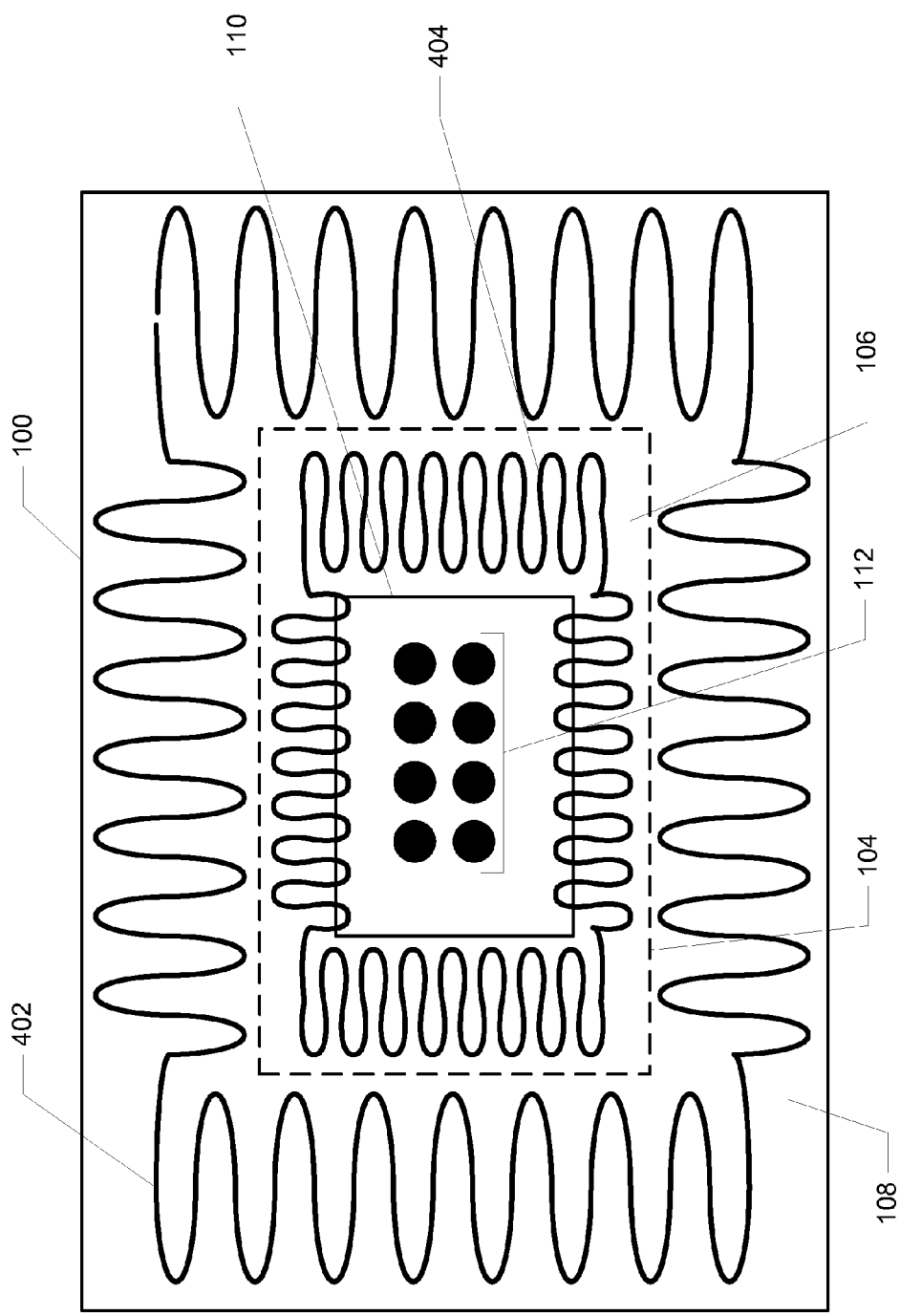
FIG. 4 illustrates a cross-sectional top view of an interposer having a first enclosed heat dissipation structure situated in a first portion of the substrate of the interposer and a second enclosed heat dissipation structure situated in a second portion of the substrate of the interposer.

FIG. 4 illustrates a cross-sectional top view of the interposer 100 having a first enclosed heat dissipation structure 402 situated in a first portion of the substrate of the interposer and a second enclosed heat dissipation structure 404 situated in a second portion of the substrate of the interposer 100. The first enclosed heat dissipation structure 402 is situated in a portion of the substrate of the interposer 100 that is adjacent to the adjacent surface 106. And the second enclosed heat dissipation structure 404 is situated in another portion of the substrate of the interposer 100 that is adjacent to the non-adjacent surface 108. The first enclosed heat dissipation structure 402 transports heated coolant near to the second enclosed heat dissipation structure 404, which conveys a separate coolant (which may be the same or different type of coolant than is in the first enclosed heat dissipation structure 402) to the edges of the interposer 100. In this example, heat conduction through a portion of the substrate of the interposer 100 that is between the first enclosed heat dissipation structure 402 and the second enclosed heat dissipation structure 404 acts to convey heat from the coolant in the first enclosed heat dissipation structure 402 to the coolant in the second enclosed heat dissipation structure 404, thereby cooling the stacked ICs.

Other configurations of enclosed heat dissipation structures within a substrate of an interposer may be used without departing from the scope of embodiments.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
a top surface comprising a first portion and a second portion;
a bottom surface comprising a third portion and a fourth portion;
a connection circuit situated within a substrate and configured to communicatively couple a first integrated circuit to a second integrated circuit, wherein the first integrated circuit defines a first area on the top surface such that the first area of the top surface is directly underneath the first integrated circuit, wherein the first area of the top surface defines the first portion of the top surface, and wherein a second area of the top surface excludes the first area of the top surface, and wherein the second area of the top surface defines the second portion, wherein the second integrated circuit defines a third area on the bottom surface such that the third area of the bottom surface is directly over the second integrated circuit, wherein the third area of the bottom surface defines the third portion of the bottom surface, and wherein a fourth area of the bottom surface excludes the third area of the bottom surface, and wherein the fourth area of the bottom surface defines the fourth portion; and
a plurality of enclosed heat dissipation structures situated within the substrate and configured to convey heat away from the first and second integrated circuits, wherein the plurality of enclosed heat dissipation structures comprises
(i) a first enclosed heat dissipation structure situated between the first portion of the top surface of the apparatus and the third portion of the bottom surface of the apparatus, and
(ii) a second enclosed heat dissipation structure situated between the second portion of the top surface of the apparatus and the fourth portion of the bottom surface of the apparatus,
wherein each of the first enclosed heat dissipation structure and the second enclosed heat dissipation structure circulates respective coolant, and
wherein the first enclosed heat dissipation structure is separate and distinct from the second enclosed heat dissipation structure such that the coolant circulating within the first enclosed heat dissipation structure does not come in contact with the coolant circulating within the second enclosed heat dissipation structure.

2. The apparatus of claim 1, wherein the connection circuit comprises one or more through-silicon vias (TSVs) configured to communicatively couple the first integrated circuit to the second integrated circuit.

3. The apparatus of claim 1, wherein at least one of the plurality of enclosed heat dissipation structure includes a first portion for causing a phase change of the coolant from liquid to gas and a second portion for causing a phase change of the coolant from gas to liquid.

4. The apparatus of claim 1, wherein at least one of the first enclosed heat dissipation structure and the second enclosed heat dissipation structure is configured to transfer heat via convection of the respective coolant.

5. The apparatus of claim 1, wherein at least one of the first enclosed heat dissipation structure and the second enclosed heat dissipation structure includes a microchannel.

6. The apparatus of claim 1, wherein at least one of the first enclosed heat dissipation structure and the second enclosed heat dissipation structure includes one or more of a serpentine-shaped channel portion, a chamber, and one or more fins.

7. A system comprising:
a first integrated circuit;
a second integrated circuit; and
an interposer disposed between a bottom surface of the first integrated circuit and a top surface of the second integrated circuit, the interposer comprising
a top surface comprising a first portion and a second portion,
a bottom surface comprising a third portion and a fourth portion,
a connection circuit situated within a substrate and configured to communicatively couple the first integrated circuit to the second integrated circuit, wherein the first integrated circuit defines a first area on the top surface of the interposer such that the first area of the top surface of the interposer is directly underneath the first integrated circuit, wherein the first area of the top surface of the interposer defines the first portion of the top surface of the interposer, and wherein a second area of the top surface of the interposer excludes the first area of the top surface of the interposer, and wherein the second area of the top surface of the interposer defines the second portion, wherein the second integrated circuit defines a third area on the bottom surface of the interposer such that the third area of the bottom surface of the interposer is directly over the second integrated circuit, wherein the third area of the bottom surface of the interposer defines the third portion of the bottom surface of the interposer, and wherein a fourth area of the bottom surface of the interposer excludes the third area of the bottom surface of the interposer, and wherein the fourth area of the bottom surface of the interposer defines the fourth portion, and a plurality of enclosed heat dissipation structures situated within the substrate, wherein the plurality of enclosed heat dissipation structures comprises (i) a first enclosed heat dissipation structure situated between the first portion of the top surface of the apparatus and the third portion of the bottom surface of the apparatus, and (ii) a second enclosed heat dissipation structure situated between the second portion of the top surface of the apparatus and the fourth portion of the bottom surface of the apparatus, wherein each of the first enclosed heat dissipation structure and the second enclosed heat dissipation structure circulates respective coolant, and wherein the first enclosed heat dissipation structure is separate and distinct from the second enclosed heat dissipation structure such that the coolant circulating within the first enclosed heat dissipation structure does not come in contact with the coolant circulating within the second enclosed heat dissipation structure.

8. The apparatus of claim 1, wherein the first integrated circuit is disposed over the first portion of the top surface of the apparatus such that an air gap exists between a bottom surface of the first integrated circuit and the first portion of the top surface of the apparatus.

9. The apparatus of claim 8, wherein the second integrated circuit is disposed below the third portion of the bottom surface of the apparatus such that another air gap exists between a top surface of the second integrated circuit and the third portion of the bottom surface of the apparatus.

10. The system of claim 7, wherein the connection circuit includes one or more of a through-silicon via and/or a through-package via.

11. The system of claim 7, wherein at least one of the first enclosed heat dissipation structure and the second enclosed heat dissipation structure comprises one or more of a channel, a chamber, a fin, a spoke, and a channel with fins.

12. The system of claim 7, wherein at least one of the first enclosed heat dissipation structure and the second enclosed heat dissipation structure includes a first portion for causing a phase change of a coolant from liquid to gas and a second portion for causing a phase change of the coolant from gas to liquid.

13. The system of claim 7, wherein the plurality of enclosed heat dissipation structures is configured to transfer heat from the first and second integrated circuits via convection of the respective coolant.

14. The system of claim 7, wherein the plurality of enclosed heat dissipation structures is contained entirely within the substrate of the interposer.

* * * * *